(12) United States Patent
Idris et al.

(10) Patent No.: US 9,581,510 B1
(45) Date of Patent: Feb. 28, 2017

(54) SPUTTER CHAMBER PRESSURE GAUGE WITH VIBRATION ABSORBER

(71) Applicant: WD Media, LLC, San Jose, CA (US)

(72) Inventors: Fadzli B. Idris, Bayan Lepas (MY); Ganesen Purushothman, Bayan Lepas (MY)

(73) Assignee: WESTERN DIGITAL TECHNOLOGIES, INC., Irvine, CA (US)

( * ) Notice: Subject to any disclaimer, the term of this patent is extended or adjusted under 35 U.S.C. 154(b) by 283 days.

(21) Appl. No.: 14/287,924

(22) Filed: May 27, 2014

Related U.S. Application Data

(60) Provisional application No. 61/916,704, filed on Dec. 16, 2013.

(51) Int. Cl.
| | |
|---|---|
| *G01L 7/00* | (2006.01) |
| *G01L 9/00* | (2006.01) |
| *G01L 19/06* | (2006.01) |
| *G01L 7/06* | (2006.01) |
| *G01L 7/02* | (2006.01) |

(52) U.S. Cl.
CPC ........ *G01L 9/0008* (2013.01); *G01L 19/0609* (2013.01); *G01L 7/02* (2013.01); *G01L 7/068* (2013.01)

(58) Field of Classification Search
CPC ......... G01L 19/0609; G01L 7/02; G01L 7/00; G01L 7/068
USPC ....................................... 73/707, 706, 729.1
See application file for complete search history.

(56) References Cited

U.S. PATENT DOCUMENTS

| | | | | |
|---|---|---|---|---|
| 1,943,954 | A * | 1/1934 | Durner | G01L 19/0007 138/26 |
| 1,957,894 | A * | 5/1934 | Longenecker | G01L 19/0007 137/207 |
| 2,715,339 | A * | 8/1955 | Honig | G01L 9/0033 200/83 R |
| 2,841,984 | A * | 7/1958 | Green | G01L 19/0645 137/557 |
| 3,158,001 | A * | 11/1964 | Bauer | G01L 7/068 73/707 |
| 3,402,608 | A * | 9/1968 | Nishigori | G01L 19/0609 138/40 |
| 3,608,436 | A * | 9/1971 | Ostroot et al. | F16L 55/04 73/707 |
| 3,898,404 | A * | 8/1975 | Martincic | G01L 19/12 200/83 C |

(Continued)

*Primary Examiner* — Jonathan Dunlap
(74) *Attorney, Agent, or Firm* — Gabriel Fitch; Loza & Loza, LLP

(57) ABSTRACT

A pressure gauge for measuring pressure in a vacuum chamber includes a flange couplable with the vacuum chamber, a pressure sensor configured to measure pressure, an air valve between the flange and the pressure sensor, and a vibration dampening assembly configured to dampen vibration in the pressure gauge. A sputtering system for sputter deposition includes a sputter chamber and the pressure gauge. The flange of the pressure gauge is coupled with the sputter chamber. A method of measuring pressure in a vacuum chamber with the pressure gauge includes coupling the flange with the vacuum chamber, dampening vibration in the pressure gauge with the vibration dampening assembly, and obtaining a pressure measurement from the pressure sensor.

30 Claims, 4 Drawing Sheets

(56) References Cited

U.S. PATENT DOCUMENTS

| | | | |
|---|---|---|---|
| 3,915,008 | A * | 10/1975 | Silverman ............ G01L 19/0609 73/707 |
| 4,352,643 | A | 10/1982 | Iijima |
| 4,355,937 | A | 10/1982 | Mack et al. |
| 4,357,859 | A * | 11/1982 | Preston ................. G01L 13/023 92/41 |
| 5,154,582 | A * | 10/1992 | Danielson ................ B01J 3/006 417/51 |
| 5,224,658 | A * | 7/1993 | Smith .................. G01N 33/241 241/27 |
| 5,452,613 | A * | 9/1995 | Bills ....................... G01L 21/02 73/706 |
| 5,508,518 | A | 4/1996 | Kendall |
| 5,538,373 | A | 7/1996 | Kirkham |
| 6,013,161 | A | 1/2000 | Chen et al. |
| 6,063,248 | A | 5/2000 | Bourez et al. |
| 6,068,891 | A | 5/2000 | O'Dell et al. |
| 6,086,730 | A | 7/2000 | Liu et al. |
| 6,099,981 | A | 8/2000 | Nishimori |
| 6,103,404 | A | 8/2000 | Ross et al. |
| 6,117,499 | A | 9/2000 | Wong et al. |
| 6,136,403 | A | 10/2000 | Prabhakara et al. |
| 6,143,375 | A | 11/2000 | Ross et al. |
| 6,145,849 | A | 11/2000 | Bae et al. |
| 6,146,737 | A | 11/2000 | Malhotra et al. |
| 6,149,696 | A | 11/2000 | Jia |
| 6,150,015 | A | 11/2000 | Bertero et al. |
| 6,156,404 | A | 12/2000 | Ross et al. |
| 6,159,076 | A | 12/2000 | Sun et al. |
| 6,164,118 | A | 12/2000 | Suzuki et al. |
| 6,200,441 | B1 | 3/2001 | Gornicki et al. |
| 6,204,995 | B1 | 3/2001 | Hokkyo et al. |
| 6,206,765 | B1 | 3/2001 | Sanders et al. |
| 6,210,819 | B1 | 4/2001 | Lal et al. |
| 6,216,709 | B1 | 4/2001 | Fung et al. |
| 6,221,119 | B1 | 4/2001 | Homola |
| 6,248,395 | B1 | 6/2001 | Homola et al. |
| 6,261,681 | B1 | 7/2001 | Suekane et al. |
| 6,270,885 | B1 | 8/2001 | Hokkyo et al. |
| 6,274,063 | B1 | 8/2001 | Li et al. |
| 6,283,838 | B1 | 9/2001 | Blake et al. |
| 6,287,429 | B1 | 9/2001 | Moroishi et al. |
| 6,290,573 | B1 | 9/2001 | Suzuki |
| 6,299,947 | B1 | 10/2001 | Suzuki et al. |
| 6,303,217 | B1 | 10/2001 | Malhotra et al. |
| 6,309,765 | B1 | 10/2001 | Suekane et al. |
| 6,357,280 | B1 * | 3/2002 | Hu ........................ G01M 3/227 73/40 |
| 6,358,636 | B1 | 3/2002 | Yang et al. |
| 6,362,452 | B1 | 3/2002 | Suzuki et al. |
| 6,363,599 | B1 | 4/2002 | Bajorek |
| 6,365,012 | B1 | 4/2002 | Sato et al. |
| 6,381,090 | B1 | 4/2002 | Suzuki et al. |
| 6,381,092 | B1 | 4/2002 | Suzuki |
| 6,387,483 | B1 | 5/2002 | Hokkyo et al. |
| 6,391,213 | B1 | 5/2002 | Homola |
| 6,395,349 | B1 | 5/2002 | Salamon |
| 6,403,919 | B1 | 6/2002 | Salamon |
| 6,408,677 | B1 | 6/2002 | Suzuki |
| 6,426,157 | B1 | 7/2002 | Hokkyo et al. |
| 6,429,984 | B1 | 8/2002 | Alex |
| 6,482,330 | B1 | 11/2002 | Bajorek |
| 6,482,505 | B1 | 11/2002 | Bertero et al. |
| 6,500,567 | B1 | 12/2002 | Bertero et al. |
| 6,528,124 | B1 | 3/2003 | Nguyen |
| 6,548,821 | B1 | 4/2003 | Treves et al. |
| 6,552,871 | B2 | 4/2003 | Suzuki et al. |
| 6,565,066 | B2 | 5/2003 | Osawa et al. |
| 6,565,719 | B1 | 5/2003 | Lairson et al. |
| 6,566,674 | B1 | 5/2003 | Treves et al. |
| 6,571,806 | B2 | 6/2003 | Rosano et al. |
| 6,628,466 | B2 | 9/2003 | Alex |
| 6,664,503 | B1 | 12/2003 | Hsieh et al. |
| 6,670,055 | B2 | 12/2003 | Tomiyasu et al. |
| 6,681,636 | B2 * | 1/2004 | Ewers ................. G01L 19/0609 73/700 |
| 6,682,807 | B2 | 1/2004 | Lairson et al. |
| 6,683,754 | B2 | 1/2004 | Suzuki et al. |
| 6,730,420 | B1 | 5/2004 | Bertero et al. |
| 6,743,528 | B2 | 6/2004 | Suekane et al. |
| 6,759,138 | B2 | 7/2004 | Tomiyasu et al. |
| 6,778,353 | B1 | 8/2004 | Harper |
| 6,795,274 | B1 | 9/2004 | Hsieh et al. |
| 6,855,232 | B2 | 2/2005 | Jairson et al. |
| 6,857,937 | B2 | 2/2005 | Bajorek |
| 6,893,748 | B2 | 5/2005 | Bertero et al. |
| 6,897,939 | B2 | 5/2005 | Hara |
| 6,899,959 | B2 | 5/2005 | Bertero et al. |
| 6,916,558 | B2 | 7/2005 | Umezawa et al. |
| 6,939,120 | B1 | 9/2005 | Harper |
| 6,946,191 | B2 | 9/2005 | Morikawa et al. |
| 6,967,798 | B2 | 11/2005 | Homola et al. |
| 6,972,135 | B2 | 12/2005 | Homola |
| 7,004,827 | B1 | 2/2006 | Suzuki et al. |
| 7,006,323 | B1 | 2/2006 | Suzuki |
| 7,016,154 | B2 | 3/2006 | Nishihira |
| 7,019,924 | B2 | 3/2006 | McNeil et al. |
| 7,043,991 | B2 * | 5/2006 | Peng ................. H01L 21/67253 73/700 |
| 7,045,215 | B2 | 5/2006 | Shimokawa |
| 7,070,870 | B2 | 7/2006 | Bertero et al. |
| 7,090,934 | B2 | 8/2006 | Hokkyo et al. |
| 7,099,112 | B1 | 8/2006 | Harper |
| 7,105,241 | B2 | 9/2006 | Shimokawa et al. |
| 7,119,990 | B2 | 10/2006 | Bajorek et al. |
| 7,147,790 | B2 | 12/2006 | Wachenschwanz et al. |
| 7,161,753 | B2 | 1/2007 | Wachenschwanz et al. |
| 7,166,319 | B2 | 1/2007 | Ishiyama |
| 7,166,374 | B2 | 1/2007 | Suekane et al. |
| 7,169,487 | B2 | 1/2007 | Kawai et al. |
| 7,174,775 | B2 | 2/2007 | Ishiyama |
| 7,179,549 | B2 | 2/2007 | Malhotra et al. |
| 7,184,139 | B2 | 2/2007 | Treves et al. |
| 7,196,860 | B2 | 3/2007 | Alex |
| 7,199,977 | B2 | 4/2007 | Suzuki et al. |
| 7,208,236 | B2 | 4/2007 | Morikawa et al. |
| 7,220,500 | B1 | 5/2007 | Tomiyasu et al. |
| 7,229,266 | B2 | 6/2007 | Harper |
| 7,239,970 | B2 | 7/2007 | Treves et al. |
| 7,252,897 | B2 | 8/2007 | Shimokawa et al. |
| 7,277,254 | B2 | 10/2007 | Shimokawa et al. |
| 7,281,920 | B2 | 10/2007 | Homola et al. |
| 7,292,329 | B2 | 11/2007 | Treves et al. |
| 7,301,726 | B1 | 11/2007 | Suzuki |
| 7,302,148 | B2 | 11/2007 | Treves et al. |
| 7,305,119 | B2 | 12/2007 | Treves et al. |
| 7,314,404 | B2 | 1/2008 | Singh et al. |
| 7,320,584 | B1 | 1/2008 | Harper et al. |
| 7,329,114 | B2 | 2/2008 | Harper et al. |
| 7,375,362 | B2 | 5/2008 | Treves et al. |
| 7,420,886 | B2 | 9/2008 | Tomiyasu et al. |
| 7,425,719 | B2 | 9/2008 | Treves et al. |
| 7,471,484 | B2 | 12/2008 | Wachenschwanz et al. |
| 7,498,062 | B2 | 3/2009 | Calcaterra et al. |
| 7,531,485 | B2 | 5/2009 | Hara et al. |
| 7,537,846 | B2 | 5/2009 | Ishiyama et al. |
| 7,549,209 | B2 | 6/2009 | Wachenschwanz et al. |
| 7,569,490 | B2 | 8/2009 | Staud |
| 7,597,792 | B2 | 10/2009 | Homola et al. |
| 7,597,973 | B2 | 10/2009 | Ishiyama |
| 7,608,193 | B2 | 10/2009 | Wachenschwanz et al. |
| 7,632,087 | B2 | 12/2009 | Homola |
| 7,656,615 | B2 | 2/2010 | Wachenschwanz et al. |
| 7,682,546 | B2 | 3/2010 | Harper |
| 7,684,152 | B2 | 3/2010 | Suzuki et al. |
| 7,686,606 | B2 | 3/2010 | Harper et al. |
| 7,686,991 | B2 | 3/2010 | Harper |
| 7,695,833 | B2 | 4/2010 | Ishiyama |
| 7,722,968 | B2 | 5/2010 | Ishiyama |
| 7,733,605 | B2 | 6/2010 | Suzuki et al. |
| 7,736,768 | B2 | 6/2010 | Ishiyama |
| 7,755,861 | B1 | 7/2010 | Li et al. |
| 7,758,732 | B1 | 7/2010 | Calcaterra et al. |

(56) References Cited

U.S. PATENT DOCUMENTS

| | | |
|---|---|---|
| 7,833,639 B2 | 11/2010 | Sonobe et al. |
| 7,833,641 B2 | 11/2010 | Tomiyasu et al. |
| 7,910,159 B2 | 3/2011 | Jung |
| 7,911,736 B2 | 3/2011 | Bajorek |
| 7,924,519 B2 | 4/2011 | Lambert |
| 7,944,165 B1 | 5/2011 | O'Dell |
| 7,944,643 B1 | 5/2011 | Jiang et al. |
| 7,955,723 B2 | 6/2011 | Umezawa et al. |
| 7,983,003 B2 | 7/2011 | Sonobe et al. |
| 7,993,497 B2 | 8/2011 | Moroishi et al. |
| 7,993,765 B2 | 8/2011 | Kim et al. |
| 7,998,912 B2 | 8/2011 | Chen et al. |
| 8,002,901 B1 | 8/2011 | Chen et al. |
| 8,003,237 B2 | 8/2011 | Sonobe et al. |
| 8,012,920 B2 | 9/2011 | Shimokawa |
| 8,038,863 B2 | 10/2011 | Homola |
| 8,057,926 B2 | 11/2011 | Ayama et al. |
| 8,062,778 B2 | 11/2011 | Suzuki et al. |
| 8,064,156 B1 | 11/2011 | Suzuki et al. |
| 8,076,013 B2 | 12/2011 | Sonobe et al. |
| 8,092,931 B2 | 1/2012 | Ishiyama et al. |
| 8,100,685 B1 | 1/2012 | Harper et al. |
| 8,101,054 B2 | 1/2012 | Chen et al. |
| 8,125,723 B1 | 2/2012 | Nichols et al. |
| 8,125,724 B1 | 2/2012 | Nichols et al. |
| 8,137,517 B1 | 3/2012 | Bourez |
| 8,142,916 B2 | 3/2012 | Umezawa et al. |
| 8,163,093 B1 | 4/2012 | Chen et al. |
| 8,171,949 B1 | 5/2012 | Lund et al. |
| 8,173,282 B1 | 5/2012 | Sun et al. |
| 8,178,480 B2 | 5/2012 | Hamakubo et al. |
| 8,206,789 B2 | 6/2012 | Suzuki |
| 8,218,260 B2 | 7/2012 | Iamratanakul et al. |
| 8,247,095 B2 | 8/2012 | Champion et al. |
| 8,257,783 B2 | 9/2012 | Suzuki et al. |
| 8,298,609 B1 | 10/2012 | Liew et al. |
| 8,298,689 B1 | 10/2012 | Sonobe et al. |
| 8,309,239 B2 | 11/2012 | Umezawa et al. |
| 8,316,668 B1 | 11/2012 | Chan et al. |
| 8,331,056 B2 | 12/2012 | O'Dell |
| 8,354,618 B1 | 1/2013 | Chen et al. |
| 8,367,228 B2 | 2/2013 | Sonobe et al. |
| 8,383,209 B2 | 2/2013 | Ayama |
| 8,394,243 B1 | 3/2013 | Jung et al. |
| 8,397,751 B1 | 3/2013 | Chan et al. |
| 8,399,809 B1 | 3/2013 | Bourez |
| 8,402,638 B1 | 3/2013 | Treves et al. |
| 8,404,056 B1 | 3/2013 | Chen et al. |
| 8,404,369 B2 | 3/2013 | Ruffini et al. |
| 8,404,370 B2 | 3/2013 | Sato et al. |
| 8,406,918 B2 | 3/2013 | Tan et al. |
| 8,414,966 B2 | 4/2013 | Yasumori et al. |
| 8,425,975 B2 | 4/2013 | Ishiyama |
| 8,431,257 B2 | 4/2013 | Kim et al. |
| 8,431,258 B2 | 4/2013 | Onoue et al. |
| 8,453,315 B2 | 6/2013 | Kajiwara et al. |
| 8,488,276 B1 | 7/2013 | Jung et al. |
| 8,491,800 B1 | 7/2013 | Dorsey |
| 8,492,009 B1 | 7/2013 | Homola et al. |
| 8,492,011 B2 | 7/2013 | Itoh et al. |
| 8,496,466 B1 | 7/2013 | Treves et al. |
| 8,517,364 B1 | 8/2013 | Crumley et al. |
| 8,517,657 B2 | 8/2013 | Chen et al. |
| 8,524,052 B1 | 9/2013 | Tan et al. |
| 8,530,065 B1 | 9/2013 | Chernyshov et al. |
| 8,546,000 B2 | 10/2013 | Umezawa |
| 8,551,253 B2 | 10/2013 | Na'Im et al. |
| 8,551,627 B2 | 10/2013 | Shimada et al. |
| 8,556,566 B1 | 10/2013 | Suzuki et al. |
| 8,559,131 B2 | 10/2013 | Masuda et al. |
| 8,562,748 B1 | 10/2013 | Chen et al. |
| 8,565,050 B1 | 10/2013 | Bertero et al. |
| 8,570,844 B1 | 10/2013 | Yuan et al. |
| 8,580,410 B2 | 11/2013 | Onoue |
| 8,584,687 B1 | 11/2013 | Chen et al. |
| 8,591,709 B1 | 11/2013 | Lim et al. |
| 8,592,061 B2 | 11/2013 | Onoue et al. |
| 8,596,287 B1 | 12/2013 | Chen et al. |
| 8,597,723 B1 | 12/2013 | Jung et al. |
| 8,603,649 B2 | 12/2013 | Onoue |
| 8,603,650 B2 | 12/2013 | Sonobe et al. |
| 8,605,388 B2 | 12/2013 | Yasumori et al. |
| 8,605,555 B1 | 12/2013 | Chernyshov et al. |
| 8,608,147 B1 | 12/2013 | Yap et al. |
| 8,609,263 B1 | 12/2013 | Chernyshov et al. |
| 8,619,381 B2 | 12/2013 | Moser et al. |
| 8,623,528 B2 | 1/2014 | Umezawa et al. |
| 8,623,529 B2 | 1/2014 | Suzuki |
| 8,634,155 B2 | 1/2014 | Yasumori et al. |
| 8,658,003 B1 | 2/2014 | Bourez |
| 8,658,292 B1 | 2/2014 | Mallary et al. |
| 8,665,541 B2 | 3/2014 | Saito |
| 8,668,953 B1 | 3/2014 | Buechel-Rimmel |
| 8,674,327 B1 | 3/2014 | Poon et al. |
| 8,685,214 B1 | 4/2014 | Moh et al. |
| 8,696,404 B2 | 4/2014 | Sun et al. |
| 8,711,499 B1 | 4/2014 | Desai et al. |
| 8,743,666 B1 | 6/2014 | Bertero et al. |
| 8,758,912 B2 | 6/2014 | Srinivasan et al. |
| 8,787,124 B1 | 7/2014 | Chernyshov et al. |
| 8,787,130 B1 | 7/2014 | Yuan et al. |
| 8,791,391 B2 | 7/2014 | Bourez |
| 8,795,765 B2 | 8/2014 | Koike et al. |
| 8,795,790 B2 | 8/2014 | Sonobe et al. |
| 8,795,857 B2 | 8/2014 | Ayama et al. |
| 2002/0060883 A1 | 5/2002 | Suzuki |
| 2003/0022024 A1 | 1/2003 | Wachenschwanz |
| 2003/0131666 A1* | 7/2003 | Ewers ............... G01L 19/0609 73/707 |
| 2004/0022387 A1 | 2/2004 | Weikle |
| 2004/0079136 A1* | 4/2004 | Pillion ............... G01N 1/24 73/23.2 |
| 2004/0131478 A1* | 7/2004 | O'Neil ............... F04B 37/08 417/313 |
| 2004/0132301 A1 | 7/2004 | Harper et al. |
| 2004/0202793 A1 | 10/2004 | Harper et al. |
| 2004/0202865 A1 | 10/2004 | Homola et al. |
| 2004/0209123 A1 | 10/2004 | Bajorek et al. |
| 2004/0209470 A1 | 10/2004 | Bajorek |
| 2005/0022604 A1* | 2/2005 | Peng ............... H01L 21/67253 73/729.2 |
| 2005/0036223 A1 | 2/2005 | Wachenschwanz et al. |
| 2005/0142990 A1 | 6/2005 | Homola |
| 2005/0150862 A1 | 7/2005 | Harper et al. |
| 2005/0151282 A1 | 7/2005 | Harper et al. |
| 2005/0151283 A1 | 7/2005 | Bajorek et al. |
| 2005/0151300 A1 | 7/2005 | Harper et al. |
| 2005/0155554 A1 | 7/2005 | Saito |
| 2005/0167867 A1 | 8/2005 | Bajorek et al. |
| 2005/0263401 A1 | 12/2005 | Olsen et al. |
| 2006/0147758 A1 | 7/2006 | Jung et al. |
| 2006/0181697 A1 | 8/2006 | Treves et al. |
| 2006/0207890 A1 | 9/2006 | Staud |
| 2007/0070549 A1 | 3/2007 | Suzuki et al. |
| 2007/0245909 A1 | 10/2007 | Homola |
| 2008/0075845 A1 | 3/2008 | Sonobe et al. |
| 2008/0093760 A1 | 4/2008 | Harper et al. |
| 2009/0117408 A1 | 5/2009 | Umezawa et al. |
| 2009/0136784 A1 | 5/2009 | Suzuki et al. |
| 2009/0169922 A1 | 7/2009 | Ishiyama |
| 2009/0191331 A1 | 7/2009 | Umezawa et al. |
| 2009/0202866 A1 | 8/2009 | Kim et al. |
| 2009/0311557 A1 | 12/2009 | Onoue et al. |
| 2010/0071438 A1* | 3/2010 | Davis ............... G01F 25/0007 73/1.34 |
| 2010/0143752 A1 | 6/2010 | Ishibashi et al. |
| 2010/0190035 A1 | 7/2010 | Sonobe et al. |
| 2010/0196619 A1 | 8/2010 | Ishiyama |
| 2010/0196740 A1 | 8/2010 | Ayama et al. |
| 2010/0209601 A1 | 8/2010 | Shimokawa et al. |
| 2010/0215992 A1 | 8/2010 | Horikawa et al. |
| 2010/0232065 A1 | 9/2010 | Suzuki et al. |
| 2010/0243440 A1 | 9/2010 | Miller et al. |
| 2010/0247965 A1 | 9/2010 | Onoue |

(56) References Cited

U.S. PATENT DOCUMENTS

| | | |
|---|---|---|
| 2010/0261039 A1 | 10/2010 | Itoh et al. |
| 2010/0279151 A1 | 11/2010 | Sakamoto et al. |
| 2010/0300884 A1 | 12/2010 | Homola et al. |
| 2010/0304186 A1 | 12/2010 | Shimokawa |
| 2011/0097603 A1 | 4/2011 | Onoue |
| 2011/0097604 A1 | 4/2011 | Onoue |
| 2011/0171495 A1 | 7/2011 | Tachibana et al. |
| 2011/0206947 A1 | 8/2011 | Tachibana et al. |
| 2011/0212346 A1 | 9/2011 | Onoue et al. |
| 2011/0223446 A1 | 9/2011 | Onoue et al. |
| 2011/0244119 A1 | 10/2011 | Umezawa et al. |
| 2011/0299194 A1 | 12/2011 | Aniya et al. |
| 2011/0311841 A1 | 12/2011 | Saito et al. |
| 2012/0069466 A1 | 3/2012 | Okamoto et al. |
| 2012/0070692 A1 | 3/2012 | Sato et al. |
| 2012/0077060 A1 | 3/2012 | Ozawa |
| 2012/0127599 A1 | 5/2012 | Shimokawa et al. |
| 2012/0127601 A1 | 5/2012 | Suzuki et al. |
| 2012/0129009 A1 | 5/2012 | Sato et al. |
| 2012/0140359 A1 | 6/2012 | Tachibana |
| 2012/0141833 A1 | 6/2012 | Umezawa et al. |
| 2012/0141835 A1 | 6/2012 | Sakamoto |
| 2012/0148875 A1 | 6/2012 | Hamakubo et al. |
| 2012/0156523 A1 | 6/2012 | Seki et al. |
| 2012/0164488 A1 | 6/2012 | Shin et al. |
| 2012/0170152 A1 | 7/2012 | Sonobe et al. |
| 2012/0171369 A1 | 7/2012 | Koike et al. |
| 2012/0175243 A1 | 7/2012 | Fukuura et al. |
| 2012/0189872 A1 | 7/2012 | Umezawa et al. |
| 2012/0196049 A1 | 8/2012 | Azuma et al. |
| 2012/0207919 A1 | 8/2012 | Sakamoto et al. |
| 2012/0225217 A1 | 9/2012 | Itoh et al. |
| 2012/0251842 A1 | 10/2012 | Yuan et al. |
| 2012/0251846 A1 | 10/2012 | Desai et al. |
| 2012/0276417 A1 | 11/2012 | Shimokawa et al. |
| 2012/0308722 A1 | 12/2012 | Suzuki et al. |
| 2013/0040167 A1 | 2/2013 | Alagarsamy et al. |
| 2013/0071694 A1 | 3/2013 | Srinivasan et al. |
| 2013/0165029 A1 | 6/2013 | Sun et al. |
| 2013/0175252 A1 | 7/2013 | Bourez |
| 2013/0216865 A1 | 8/2013 | Yasumori et al. |
| 2013/0230647 A1 | 9/2013 | Onoue et al. |
| 2013/0314815 A1 | 11/2013 | Yuan et al. |
| 2014/0011054 A1 | 1/2014 | Suzuki |
| 2014/0044992 A1 | 2/2014 | Onoue |
| 2014/0050843 A1 | 2/2014 | Yi et al. |
| 2014/0151360 A1 | 6/2014 | Gregory et al. |

\* cited by examiner

SPUTTER CHAMBER PRESSURE GAUGE WITH VIBRATION ABSORBER

CROSS-REFERENCE TO RELATED APPLICATION

This application claims the benefit of U.S. Provisional Application Ser. No. 61/916,704, filed on Dec. 16, 2013, which is expressly incorporated by reference herein in its entirety.

BACKGROUND

Machines that utilize pressure may include a pressure gauge to monitor pressure. One such machine is a sputter machine for production of magnetic media for hard disk drives. Sputter machines include multiple sputter chambers, which are under pressure during operation (sputter deposition). A conventional pressure gauge may be coupled to a sputter chamber to measure the pressure of the sputter chamber. The pressure sensor may be connected to a manufacturing computer to provide real time pressure measurements. However, during magnetic media production, the sputter chamber can experience vibration. One source of the vibration can be due to a carrier holder traveling from one sputter chamber to the next. Another source of the vibration can be a gate valve assembly opening and closing. This vibration may result in the pressure gauge proving a false reading, which can even lead to stopping the sputter chamber operation.

Thus, there is a need in the art for a pressure gauge for use with a sputter chamber that prevents false readings due to vibration originating from the sputter chamber.

BRIEF DESCRIPTION OF THE DRAWINGS

Various aspects of the present invention will now be presented in the detailed description by way of example, and not by way of limitation, with reference to the accompanying drawings, wherein.

DETAILED DESCRIPTION

Figure 1:
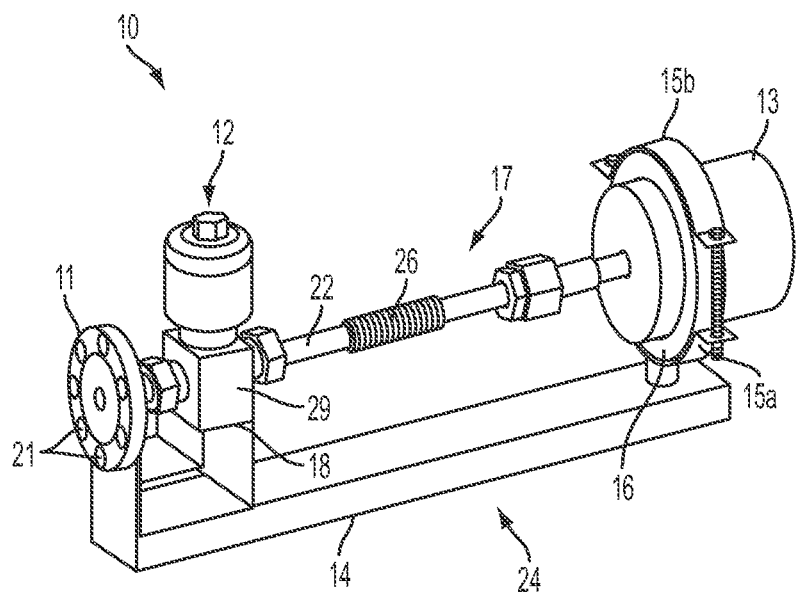
FIG. 1 is a perspective view of an exemplary embodiment of a pressure gauge.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The various aspects of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus or method.

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus, method or article of manufacture does not require that all embodiments of the invention include the described components, structure, features, functionality, processes, advantages, benefits, or modes of operation.

Any reference to an element herein using a designation such as "first," "second," and so forth does not generally limit the quantity or order of those elements. Rather, these designations are used herein as a convenient method of distinguishing between two or more elements or instances of an element. Thus, a reference to first and second elements does not mean that only two elements can be employed, or that the first element must precede the second element.

As used herein, the terms "comprises," "comprising," "includes," and/or "including," when used herein, specify the presence of the stated features, integers, steps, operations, elements, and/or components, but do not preclude the presence or addition of one or more other features, integers, steps, operations, elements, components, and/or groups thereof In the following detailed description, various aspects of the present invention will be presented in the context of apparatuses and methods for measuring pressure in a sputtering system (e.g., a sputter chamber of the sputtering system) used to produce magnetic media for hard disk drives (HDD). However, those skilled in the art will realize that these aspects may be extended to any suitable application where it is desirable to accurately measure pressure of a chamber with a pressure gauge when vibration originates from the chamber (e.g., to avoid a false reading in a pressure gauge due to pressure originating from the chamber). Accordingly, any reference to a measuring pressure of a sputter chamber of a sputtering system used to produce magnetic media for an HDD is intended only to illustrate the various aspects of the present invention, with the understanding that such aspects may have a wide range of applications.

Figure 2:
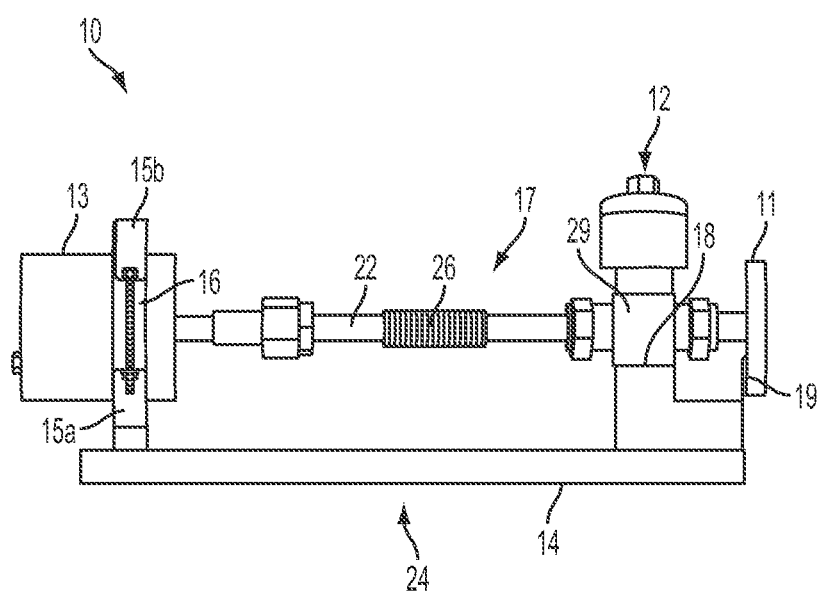
FIG. 2 is a side view of the exemplary embodiment pressure gauge of FIG. 1.
Figure 3:
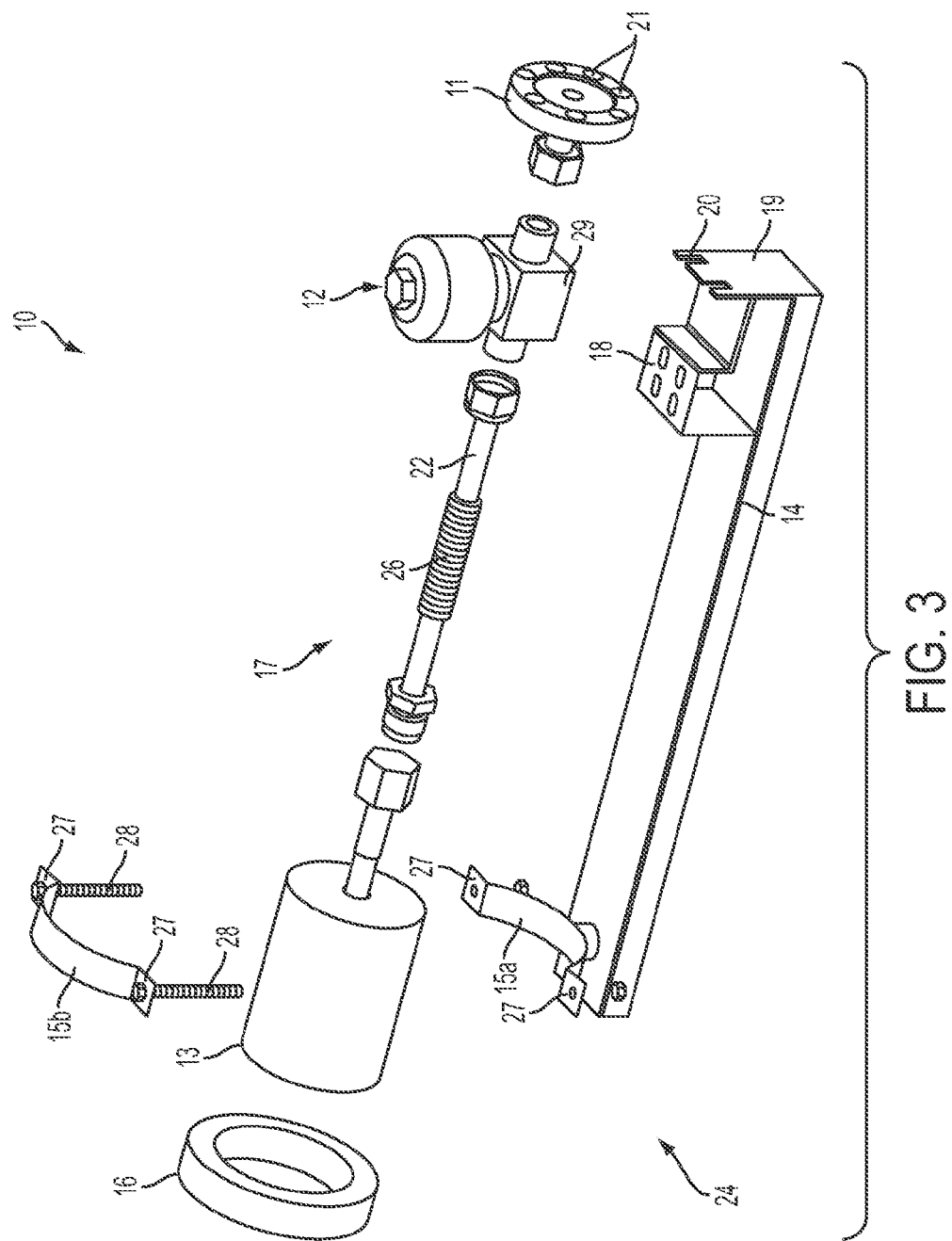
FIG. 3 is an exploded view of the exemplary embodiment pressure gauge of FIG. 1.
Figure 5:
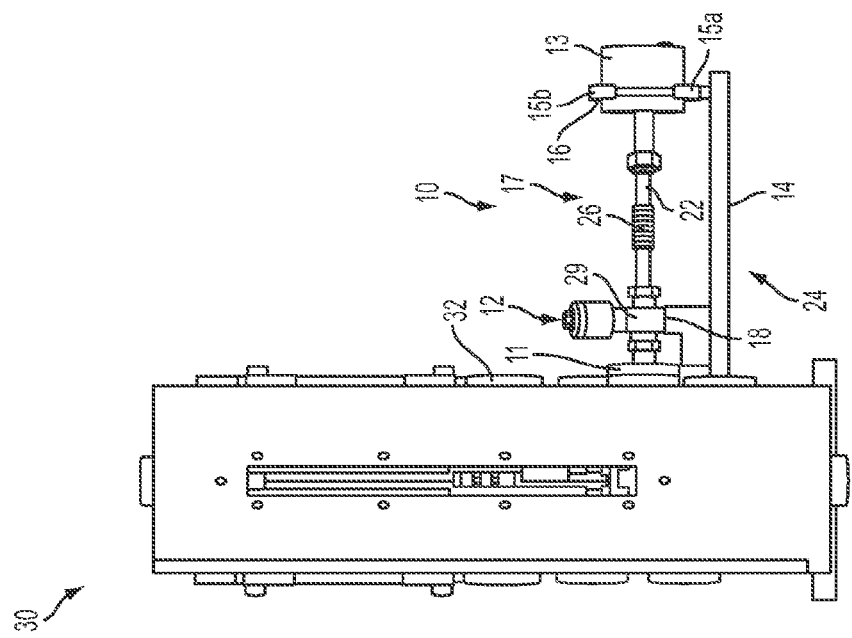
FIG. 5 is a side view of the exemplary embodiment sputtering system of FIG. 4 coupled with the exemplary embodiment pressure gauge of FIG. 1.
Figure 4:
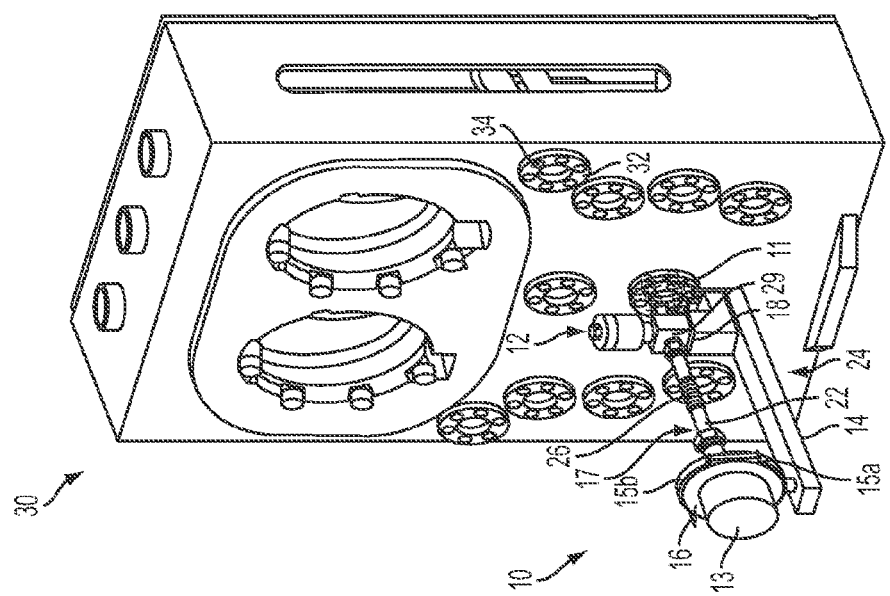
FIG. 4 is a perspective view of an exemplary embodiment of a sputtering system having a sputtering chamber coupled with the exemplary embodiment pressure gauge of FIG. 1.

FIGS. 1-3 are various views of an exemplary embodiment of a pressure gauge 10. The pressure gauge 10 may generally include a flange 11, an air valve 12, and a pressure sensor 13, where all three are mechanically and fluidly connected. Pressure sensor 13 may be a capacitance manometer. For example, the pressure sensor may be a Baratron® capacitance manometer manufactured by MKS Instruments Inc. The pressure gauge 10 may further include a vibration dampening assembly 24 configured to dampen vibration in the pressure gauge 10. In one exemplary embodiment, the vibration may originate from a sputter chamber 30 of a sputtering system (FIGS. 4 and 5). The dampening assembly 24 may be configured to dampen the vibration originating from the sputter chamber 30 thereby minimizing the propagation of the vibration through the pressure gauge 10.

Without the vibration dampening assembly 24, the vibration originating from the sputter chamber 30 may propagate through a pressure gauge and cause the pressure sensor to measure an incorrect pressure. The incorrect pressure measurement may trigger an alarm that requires inspection and possible interruption of the sputtering process. By dampening the vibration with the vibration dampening assembly 24, the pressure sensor 13 of the pressure gauge 10 will accurately measure the pressure in the sputter chamber 30, thereby avoiding and/or reducing the occurrence of a false alarm.

The vibration dampening assembly 24 may include an air conduit 17, a ring member 16, a clamp member 15a, 15b, and a base member 14. The air valve 12 and pressure sensor 13 may be connected to each other through the air conduit 17. As shown in FIGS. 1-3, one end of the air conduit 17 may be coupled with the pressure sensor 13 and the opposite end may be coupled with the air valve 12. The air conduit 17 may be coupled to the pressure sensor 13 and the air vale 12 through any suitable fastening mechanism, such as through a threaded portion. The air conduit 17 may be configured to reduce vibration originating from the sputter chamber 30 of the sputtering system. The air conduit 17 may include a tube 22 and a flexible bellows 26. The flexible bellows 26 may circumferentially surround a portion of the tube 22. As shown in FIGS. 1-3, the flexible bellows 26 may extend along a longitudinal axis of the tube 22 and may be approximately centered relative to the ends of the tube 22. Due to the flexible nature, the flexible bellows 26 assists in dampening vibration propagating through the tube 22.

The ring member 16 may be coupled with pressure sensor 13 and may be configured to further reduce vibration at the pressure sensor 13. The ring member 16 may be made from any suitable material that is capable of dampening vibration at the pressure sensor. For example the ring member 16 may comprise a sponge material. As shown in FIGS. 1-2, the ring member 16 may circumferentially surround the pressure sensor 13. The ring member 16 may be disposed around the pressure sensor 13 at any location suitable for optimally dampening vibration at the pressures sensor 13. For example, as shown in FIGS. 1-2, the ring member 16 may be disposed around the pressure sensor 13 such that the ring member 16 is closer to the end of the pressure sensor 13 coupled with the air conduit 17.

The ring member 16 may be secured around the pressure sensor 13 by the clamp member 15a, 15b. The clamp member may include a first portion 15a, and a second portion 15b. Each of the first portion 15a and the second portion 15b may be curved to correspond to the curvature of the ring member 16. As shown in FIGS. 1-3, the first portion 15a may surround an upper portion of the ring member 16 while the second portion 15b may surround a lower portion of the ring member 16. The first portion 15a may be coupled with the base member 14. As shown in FIG. 3, the first portion 15a may be integrally formed with the base member 14 to provide optimal stability. The second portion 15b may be a separate piece that is mechanically coupled to the first portion 15a. For example, as shown in FIG. 3, each of the first portion 15a and the second portion 15b may include tabs 27 with through holes. The tabs 27 may extend radially away from the ring member 16. The vibration dampening assembly 23 may include a plurality of securing member 28 that may pass through the through holes of the tabs 27 to secure the first portion 15a to the second portion 15b. For example, as shown in FIGS. 1-3, two sets of nuts and bolts may be used to secure the first portion 15a to the second portion 15b.

The base member 14 may further include a seat 18 for receiving the underside surface of the air valve 12. The air valve 12 may include a body 29 that houses the flow path. As shown in FIGS. 1-2, one end of the body 29 may be coupled with the air conduit 17 and the opposing end may be coupled with the flange 11. The seat 18 may be shaped to match the shape of the underside surface of the body 29 to provide optimal support. For example, as shown in FIG. 3, when the body 29 has a generally square shaped underside surface, the seat 18 may similarly have a square shaped surface. The body 29 may be mounted onto the seat 18 of the base member 14. The seat 18 may include one or more through holes (e.g., four) to securely mount the body 29 onto the seat 18. Any suitable fastening member (not shown) may be used to secure the body 29 to the seat 18. The securing of the valve 12 to the base member 14 provides a point of stability in addition to the clamp member 15a, 15b.

As shown in FIG. 3, the base member 14 may further include a free end portion 19 that extends substantially perpendicular relative to the longitudinal axis of the base member (e.g. upwardly). The free end portion 19 may include holes 20 having an open upper edge (e.g., the material of the base portion does not surround all sides of the holes). The holes 20 may also be referred to as cutouts. While two holes are shown in the exemplary embodiment, it should be understood that one hole or more than two holes may also be used. Furthermore, while shown having a rectangular shape, the holes may have any shape that is capable of receiving a securing member (e.g., a screw, a bolt, and the like). Additionally, instead of having an open upper edge the holes may be enclosed (e.g., such that the entire perimeter of the hole is surrounded by the material of the base portion).

The length of the free end portion 19 and location of the cutouts 20 may be configured such that the cutouts 20 are aligned with the flange 11 to provide stable engagement of the base member 14 with the flange 11. As shown in FIGS. 1 and 3, the flange 11 may include a plurality of through holes 21 along the circumferential edge of the flange face. The through holes 21 may pass entirely through flange. The through holes 21 may be threaded. As best shown in FIGS. 1 and 2, when the air valve 12, pressure sensor 13, and flange 11 are mounted onto the base member 14, each of the cutouts 20 may align with one of the holes 21 of the flange 11. Thus, a securing member (not shown), such as a screw, may pass through the flange via the holes 21 and then pass through the cutouts 20. In another exemplary embodiment the cutouts may be threaded such that a securing member may be securely fixed within a cutout.

FIGS. 4 and 5 show a perspective view and a side view, respectively, of the pressure gauge 10 coupled with a sputtering system having a sputter chamber 30. As best shown in FIG. 4, the sputter chamber 30 may include a plurality of mounting rings 32. Each of the mounting rings may include a plurality of holes 34. The number and positioning of the holes 34 of each of the mounting rings 32 of the sputter chamber 30 may correspond to the number and positioning of the holes 21 of the flange 11. Thus, when the flange 11 is aligned with one of the rings 32, each of the holes 21 of the flange 11 will be aligned with one of the holes 34 of the ring 32. Once aligned, the user can then secure the pressure gauge 10 to the sputter chamber 30 by passing securing member (not shown) through the aligned holes 21, 34. As noted above, two of the holes 21 of the flange 11 may be aligned with the cutouts 20 of the base member 14 after the flange 11 has been mounted to the base member 14. Thus, once the flange 11 is aligned with the mounting ring 32, each of the cutouts 20 will be aligned with one of the holes 21 of the flange 11 and one of the holes 34 of the mounting ring 32. A securing member such as screw can be inserted through each of the sets of holes. The securing member that passes through holes 11, 21 that are aligned with a cutout 20, may also pass into the cutout 20. This arrangement provides for an additional point of stability for the pressure gauge relative to the sputter chamber 30.

While only one pressure gauge 10 is shown as being coupled with the sputter chamber 30, it should be understood that more than one pressure gauge 10 may be coupled with the sputter chamber 30 via another ring 32. For example, a second pressure gauge (or more) may provide a backup measurement if another pressure gauge fails, or may ensure that the other pressure gauge (or gauges) is running properly. For example, if two pressure gauges are providing different pressure measurements then this may indicate that one of the gauges is not working properly.

Figure 6:
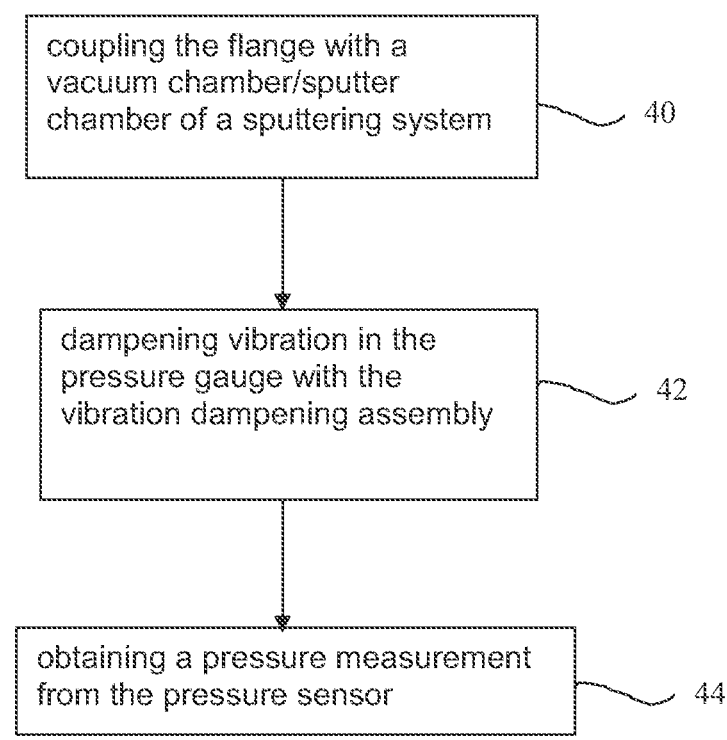
FIG. 6 is a flowchart of a method of measuring pressure in a vacuum chamber with a pressure gauge.

FIG. 6 is a flowchart illustrating a method of measuring pressure in a vacuum chamber with the pressure gauge 10. The method may begin with step 40, coupling the flange with a vacuum chamber/sputter chamber 30 of a sputtering system. The coupling the flange 11 with the vacuum chamber 30 may include first aligning the flange 11 of the pressure gauge 10 with the mounting ring 32. The aligning the flange 11 with mounting ring 32 may further include aligning the holes 21 of the flange 11 and the holes 20 of the base member 14 with the holes 34 of the mounting ring 32. Once aligned, the user may then secure the flange 11 to the mounting ring 34 by inserting a securing member (e.g., a screw) through holes 21, 34. The securing member may pass through each of the sets of holes 21, 34. With respect to holes 21, 34 that are aligned with the holes 20 of the base member 14, the securing member may also be inserted into the holes 20.

After the pressure gauge 10 is secured to the vacuum chamber 30, the method may proceed to step 42, dampening vibration in the pressure gauge 10 with the vibration dampening assembly 24. As noted above, during operation of the sputter chamber, vibrations may be produced that may propagate into the pressure gauge. Thus, the dampening assembly 24 dampens these vibrations to prevent the vibrations from interfering with reading of the pressure sensor 3. The vibration may be dampened at least in part by the bellows 26 surrounding the tube 22. The vibration may further be dampened by the ring member being secured around the circumferences of the pressure sensor 13.

The method may then proceed to step 44 of obtaining a pressure measurement from the pressure sensor. Because the vibration has been dampened by the dampening assembly, the pressure sensor is more likely to provide an accurate pressure reading.

The method may further include repeating the steps of dampening the vibration and obtaining the pressure reading periodically. The obtained pressure measurement may be monitored by a computer controller. The computer controller may be configured to report an alert if an obtained pressure measurement is higher or lower than a predetermined acceptable range. The pressure measurement may be obtained on a constant basis by the computer controller so that a "real time" measurement is always available and so that an alert can be generated immediately if the measured pressure falls outside of the predetermined range.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112(f) unless the element is expressly recited using the phrase "means for" or, in the case of a method claim, the element is recited using the phrase "step for."

What is claimed is:

1. A pressure gauge for measuring pressure in a vacuum chamber, the pressure gauge comprising:
    a flange couplable with the vacuum chamber;
    a pressure sensor configured to measure pressure;
    an air valve between the flange and the pressure sensor; and
    a vibration dampening assembly disposed between the air valve and the pressure sensor configured to dampen vibration in the pressure gauge.

2. The pressure gauge of claim 1, wherein the vibration dampening assembly further comprises an air conduit between the air valve and the pressure sensor, and wherein the air conduit is configured to dampen vibration from the vacuum chamber.

3. The pressure gauge of claim 2, wherein a portion of the air conduit is flexible along a longitudinal axis of the air conduit.

4. The pressure gauge of claim 3, wherein the flexible portion comprises a bellows.

5. The pressure gauge of claim 1, wherein the vibration dampening assembly further comprises a ring member circumferentially coupled to the pressure sensor, and wherein the ring member is configured to dampen vibration at the pressure sensor.

6. The pressure gauge of claim 5, wherein the vibration dampening assembly further comprises a clamp member configured to secure the ring member to the pressure sensor.

7. The pressure gauge of claim 6, wherein the clamp member comprises a first portion and a second portion coupled with the first portion, wherein the vibration dampening assembly further comprises a base member, and wherein the base member comprises the first portion of the of the clamp member.

8. The pressure gauge of claim 1, wherein the pressure sensor comprises a capacitance manometer.

9. The pressure gauge of claim 1, wherein the vibration dampening assembly further comprises a base member having a valve seat, and wherein the air valve is coupled to the valve seat.

10. The pressure gauge of claim 1, wherein the flange comprises a least one through hole, wherein the vibration dampening assembly further comprises a base member having at least one through hole, and wherein the at least one through hole of the flange is aligned with the at least one through hole of the base member.

11. A sputtering system for sputter deposition, comprising:
    a sputter chamber; and
    a pressure gauge comprising:

a flange coupled with the sputter chamber;
a pressure sensor configured to measure pressure;
an air valve between the flange and the pressure sensor; and
a vibration dampening assembly disposed between the air valve and the pressure sensor configured to dampen vibration in the pressure gauge.

12. The sputtering system of claim 11, wherein the vibration dampening assembly further comprises an air conduit between the air valve and the pressure sensor, and wherein the air conduit is configured to dampen vibration from the sputter chamber.

13. The sputtering system of claim 12, wherein a portion of the air conduit is flexible along a longitudinal axis of the air conduit.

14. The sputtering system of claim 13, wherein the flexible portion comprises a bellows.

15. The sputtering system of claim 11, wherein the vibration dampening assembly further comprises a ring member circumferentially coupled to the pressure sensor, and wherein the ring member is configured to dampen vibration from the pressure sensor.

16. The sputtering system of claim 15, wherein the vibration dampening assembly further comprises a clamp member configured to secure the ring member to the pressure sensor.

17. The sputtering system of claim 16, wherein the clamp member comprises a first portion and a second portion coupled with the first portion, wherein the vibration dampening assembly further comprises a base member, and wherein the base member comprises the first portion of the of the clamp member.

18. The sputtering system of claim 11, wherein the pressure sensor comprises a capacitance manometer.

19. The sputtering system of claim 11, wherein the vibration dampening assembly further comprises a base member having a valve seat, and wherein the air valve is coupled to the valve seat.

20. The sputtering system of claim 11, wherein the flange comprises a least one through hole, wherein the vibration dampening assembly further comprises a base member having at least one through hole, and wherein the at least one through hole of the flange is aligned with the at least one through hole of the base member.

21. A method of measuring pressure in a vacuum chamber with a pressure gauge, the pressure gauge having a flange, a pressure sensor, an air valve between the flange and the pressure sensor, and a vibration dampening assembly, the method comprising:

coupling the flange with the vacuum chamber;
dampening vibration in the pressure gauge with the vibration dampening assembly disposed between the air valve and the pressure sensor; and
obtaining a pressure measurement from the pressure sensor.

22. The method of claim 21, wherein the vibration dampening assembly further comprises an air conduit between the air valve and the pressure sensor, and wherein the dampening the vibration in the pressure gauge further comprises dampening vibration from the vacuum chamber with the air conduit.

23. The method of claim 22, wherein a portion of the air conduit is flexible along a longitudinal axis of the air conduit.

24. The method of claim 23, wherein the flexible portion comprises a bellows.

25. The method of claim 21, wherein the vibration dampening assembly further comprises a ring member circumferentially coupled to the pressure sensor, and wherein the dampening the vibration in the pressure gauge further comprises dampening vibration from the pressure sensor with the ring member.

26. The method of claim 25, wherein the vibration dampening assembly further comprises a clamp member, the method further comprising securing the ring member to the pressure sensor.

27. The method of claim 26, wherein the clamp member comprises a first portion and a second portion coupled with the first portion, wherein the vibration dampening assembly further comprises a base member, and wherein the base member comprises the first portion of the of the clamp member.

28. The method of claim 21, wherein the pressure sensor comprises a capacitance manometer.

29. The method of claim 21, wherein the vibration dampening assembly further comprises a base member having a valve seat, and wherein the air valve is coupled to the valve seat.

30. The method of claim 21, wherein the flange comprises a least one through hole, wherein the vibration dampening assembly further comprises a base member having at least one through hole, and wherein the at least one through hole of the flange is aligned with the at least one through hole of the base member.

* * * * *